United States Patent [19]
Sawada et al.

[11] Patent Number: 5,390,870
[45] Date of Patent: Feb. 21, 1995

[54] RECORDING MEDIUM CASSETTE AND A RECORDING/REPRODUCING APPARATUS

[75] Inventors: Takashi Sawada; Yoichirou Senshu, both of Kanagawa; Akihiro Uetake, Tokyo; Chiaki Sugai; Shuichi Ota, both of Kanagawa; Hiroshi Fujii, Tokyo; Shinichi Hasegawa, Chiba; Kazuyoshi Suzuki, Tokyo; Tetsuro Morii, Chiba, all of Japan

[73] Assignee: Sony Corporation, Tokyo, Japan

[21] Appl. No.: 67,811

[22] Filed: May 27, 1993

[30] Foreign Application Priority Data

Jun. 1, 1992 [JP] Japan .................. 4-163414
Jun. 2, 1992 [JP] Japan .................. 4-165443
Jul. 15, 1992 [JP] Japan .................. 4-209470

[51] Int. Cl.$^6$ .................................... G11B 15/04
[52] U.S. Cl. .................................... 242/344
[58] Field of Search ............... 242/197, 198, 199, 344; 360/69, 94, 132

[56] References Cited

U.S. PATENT DOCUMENTS

| | | | |
|---|---|---|---|
| 3,601,558 | 8/1971 | Sugaya et al. | 360/132 X |
| 4,041,537 | 8/1977 | Kishi | 360/132 X |
| 4,280,136 | 7/1981 | Kashima et al. | 360/132 X |
| 4,338,644 | 7/1982 | Staar | 360/132 |
| 4,383,285 | 5/1983 | Staar . | |
| 4,426,684 | 1/1984 | Sechet et al. | 364/900 |
| 4,743,984 | 5/1988 | Ryan | 360/60 |
| 4,839,875 | 6/1989 | Kuriyama et al. | 369/14 |
| 4,864,448 | 9/1989 | Karibe et al. | 360/132 |
| 4,897,750 | 1/1990 | Hanson et al. | 360/132 |
| 5,055,947 | 10/1991 | Satoh | 360/132 X |
| 5,239,437 | 8/1993 | Hoge et al. | 360/132 |

FOREIGN PATENT DOCUMENTS

| | | |
|---|---|---|
| 0265167 | 4/1988 | European Pat. Off. . |
| 0373718 | 6/1990 | European Pat. Off. . |
| 0533002 | 3/1993 | European Pat. Off. . |
| 51-100666 | 6/1982 | Japan .................. 360/132 |
| 61-94287 | 5/1986 | Japan .................. 360/132 |
| 1315142 | 4/1973 | United Kingdom . |
| 2208029 | 2/1989 | United Kingdom . |
| WO84/03791 | 9/1984 | WIPO . |
| WO91/02355 | 2/1991 | WIPO . |

*Primary Examiner*—Daniel P. Stodola
*Assistant Examiner*—John P. Darling
*Attorney, Agent, or Firm*—William S. Frommer; Alvin Sinderbrand

[57] ABSTRACT

A recording medium cassette being easily miniaturized if necessary, and a recording and/or reproducing apparatus, such as a VTR, adapted to use the same recording medium cassette. The recording medium cassette includes a printed wiring board having a plurality of information indicating contacts and which is fixed to the bottom wall of a case of the recording medium cassette so that the information indicating contacts are accessible from outside through slots formed in the bottom wall. The recording and/or reproducing apparatus is provided with a plurality of information detecting contacts respectively corresponding to the information indicating contacts of the recording medium cassette. The information detecting contacts may respectively contact the information indicating contacts upon insertion of the recording medium cassette into the recording and/or reproducing apparatus so as to enable information to be transferred therebetween. The VTR is adapted to use both a small-sized tape cassette and a large-sized tape cassette.

16 Claims, 16 Drawing Sheets

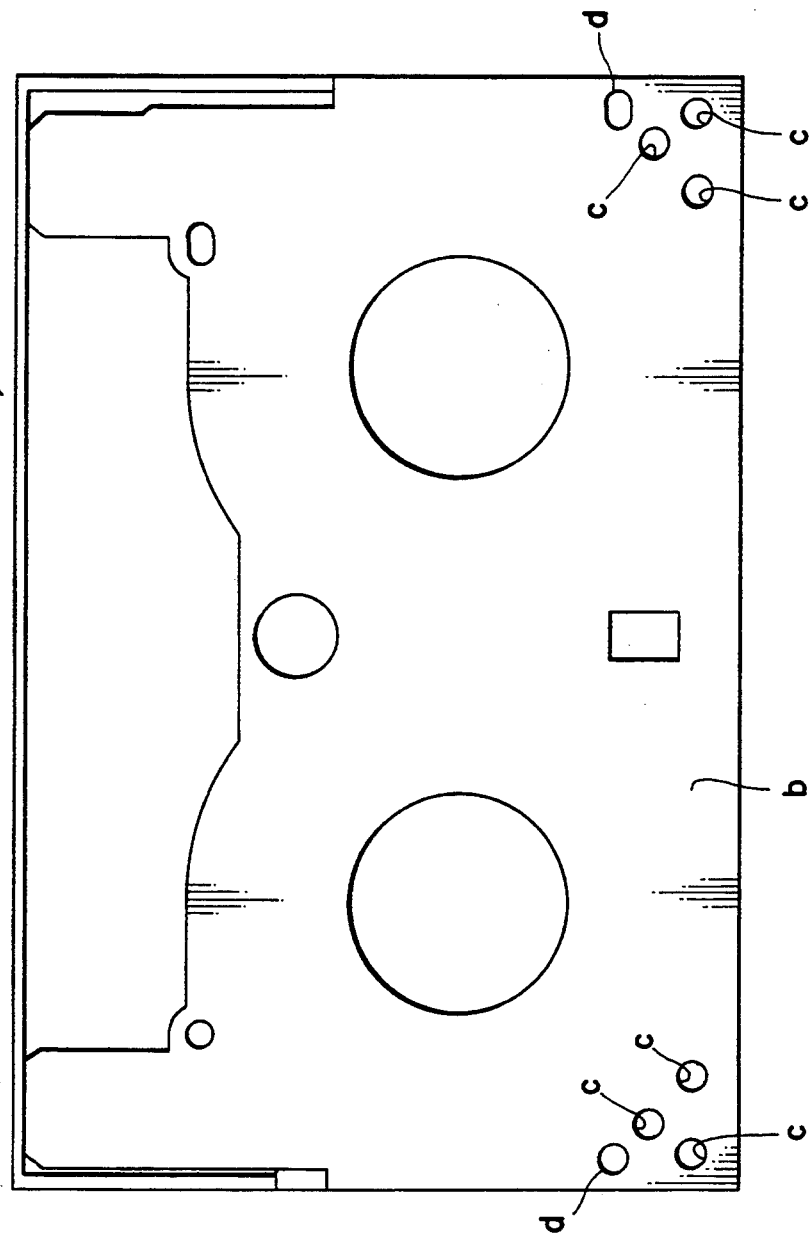

RECORDING MEDIUM CASSETTE AND A RECORDING/REPRODUCING APPARATUS

BACKGROUND OF THE INVENTION

1. Field of the Invention

The present invention relates to a recording medium cassette, and to a recording and/or reproducing apparatus. More specifically, the present invention relates to a recording medium cassette capable of being optionally provided with additional identifiers and of being easily miniaturized if necessary, and having satisfactory appearance, and to a recording and/or reproducing apparatus suitable for using the same recording medium cassette.

2. Description of the Related Art

The related-art recording medium cassette, such as a tape cassette a shown in FIG. 20 for use on an 8 mm video tape recorder (hereinafter abbreviated to "VTR"), is provided with recognition holes indicating pieces of information about the magnetic tape including the type of the magnetic tape and the thickness of the magnetic tape.

As shown in FIG. 20, the tape cassette a is provided with recognition holes c in the bottom wall b thereof in the opposite rear corners. These recognition holes c are allocated to pieces of information including the type of the magnetic tape and the thickness of the magnetic tape.

When the tape cassette a is inserted in a VTR, the detecting pins of switches are inserted in the recognition holes c, respectively, to read the pieces information on the basis of the respective depths of insertion of the detecting pins in the recognition holes c. In FIG. 20, indicated at d are positioning holes.

In this related-art tape cassette a, the recognition holes c are either open or closed to indicate pieces of information. Accordingly, the recognition holes c need to be formed in portions of the bottom wall b of the tape cassette a having a thickness large enough to form the recognition holes c. Consequently, the recognition holes c can be formed only in limited areas of the surface of the bottom wall b and the restriction holes c diminishes the area of the surface of the bottom wall b available for other uses.

Furthermore, if the recognition holes need to be formed in the opposite corners of the rear side of the bottom wall, the positions of the recognition holes of a small-sized tape cassette on the VTR and those of the corresponding recognition holes of a large-sized tape cassette on the same VTR are different from each other.

Accordingly, a VTR which is designed to use both the small-sized tape cassette and the large-sized tape cassette must be provided with two sets of switches, namely, one set of switches for the recognition holes of the small-sized tape cassette and another set of switches for the recognition holes of the large-sized tape cassette, or one set of switches which can be shifted according to the size of the tape cassette. Such an arrangement of the switches makes the construction of the VTR complex.

Since each recognition hole is allocated to a single piece of information, the number of recognition holes increases with the increase of the number of pieces of information, increasing area and volume necessary for forming the recognition holes, which makes the miniaturization of the tape cassette difficult.

Further, since the recognition holes c are identified by physical items such as position and depth thereof, identifiers which are not taken into consideration when prescribing a format cannot be added.

Furthermore, a large number of recognition holes spoils the appearance of the bottom surface of the tape cassette.

Recording medium cassettes provided with an IC chip for storing information about the recording medium cassettes have been proposed, for example, in:

U.S. Pat. No. 4,338,644 Jul. 6, 1982 (Theophiel C. J. L. Starr)

U.S. Pat. No. 4,383,285 May 10, 1983 (Theophiel C. J. L. Starr)

U.S. Pat. No. 4,426,684 Jan. 17, 1984 (Claude Sechet et al.)

U.S. Pat. No. 4,839,875 Jul. 13, 1989 (Zenkichi Kuriyama et al.)

Although these previously proposed recording medium cassettes facilitate storing information about the recording medium cassettes, the IC chip increases the cost of the recording medium cassettes.

SUMMARY OF THE INVENTION

Accordingly, it is an object of the present invention to provide a recording medium cassette capable of being optionally provided with additional information and of being formed in a relatively small size, and having satisfactory appearance.

A second object of the present invention is to provide a recording medium cassette having an information indicating means for indicating information about the recording medium, facilitating the detection of the information.

A third object of the present invention is to provide a recording/reproducing apparatus or a reproducing apparatus capable of using such a recording medium cassette.

A recording medium cassette in accordance with the present invention has a case provided with a plurality of exposed information indicating contacts, and a recording/reproducing apparatus or a reproducing apparatus in accordance with the present invention is provided with a plurality of information detecting contacts respectively corresponding to the plurality of information indicating contacts of the recording medium cassette, and a power supply having an output terminal connected to one of the plurality of information detecting contacts.

In one aspect of the present invention, a recording medium cassette capable of being used on a compatible recording/reproducing apparatus capable of using at least two kinds of recording medium cassettes differing in size from each other is provided with information indicating means which coincides with those of another recording medium cassette of a different size when the mouth thereof coincides with that of the latter recording medium cassette.

In another aspect of the present invention, a recording/reproducing apparatus capable of using both recording medium cassettes differing in size from each other and of positioning those different recording medium cassettes with their mouths positioned at a fixed position therein, and provided with a fixed information detecting means capable of detecting pieces of information indicated by the information indicating contacts of either of the recording medium cassettes.

Since the information indicating contacts are exposed, the thickness of the recording medium cassette need not be very large, and the information indicating contacts are not highly subject to positional restrictions. The recording medium cassette can be miniaturized because the information indicating contacts may be formed in a relatively small size in a relatively small area.

When each information indicating contact is used for indicating a bit of a signal instead of allocating the information indicating contact to one of the identifiers identifying the category of the recording medium cassette, a comparatively large number of pieces of information can be indicated by a comparatively small number of information indicating contacts; for example, eight identifiers by three indication indicating contacts, i.e., three bits, and sixteen identifiers by four indication indicating contacts, i.e., four bits.

Identifiers which are not taken into consideration when prescribing a format can be easily added to the format without modifying or without changing the size of the recording medium cassette, which enhances the extendibility of the format.

Since the information indicating contacts do not need too many holes formed in the case of the recording medium cassette need not be provided with too many holes, the information indicating contacts do not spoil the appearance of the recording medium cassette.

Since the positions of the information indicating contacts of the large-sized recording medium cassette in accordance with the present invention on the recording/reproducing apparatus are the same as those of the corresponding information indicating contacts of the small-sized recording medium cassette in accordance with the present invention, the recording/reproducing apparatus needs only a single information detecting means.

BRIEF DESCRIPTION OF THE PREFERRED EMBODIMENTS

The above and other objects, features and advantages of the present invention will become more apparent from the following description taken in connection with the accompanying drawings, in which:

FIG. 20 is a bottom view of a related-art recording medium cassette.

DETAILED DESCRIPTION OF THE PREFERRED EMBODIMENTS

Figure 1:
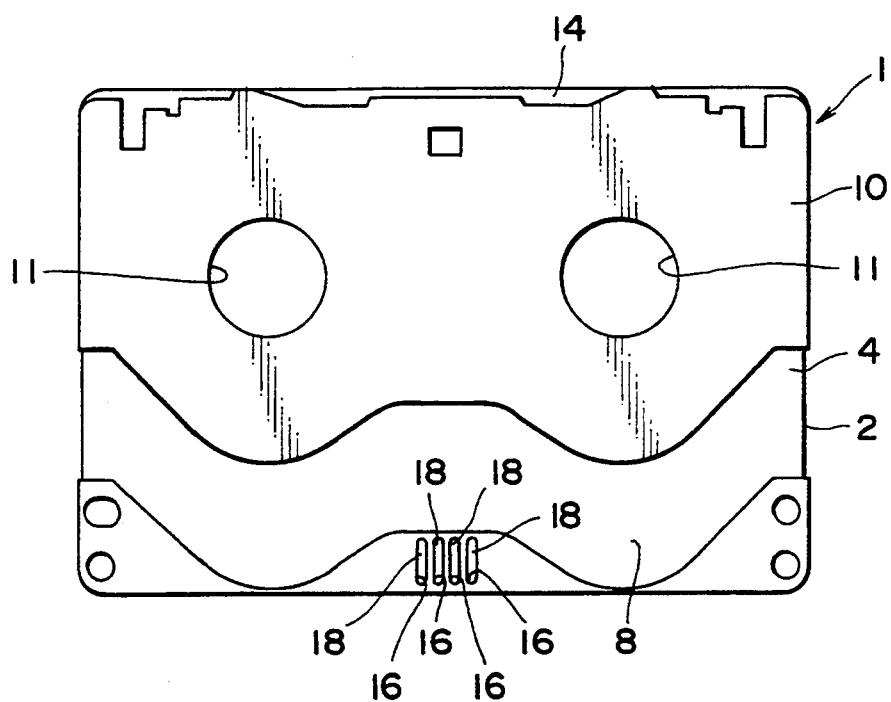
FIG. 1 is a bottom view of a small-sized video tape cassette in a state where the shutter thereof is closed.
Figure 2:
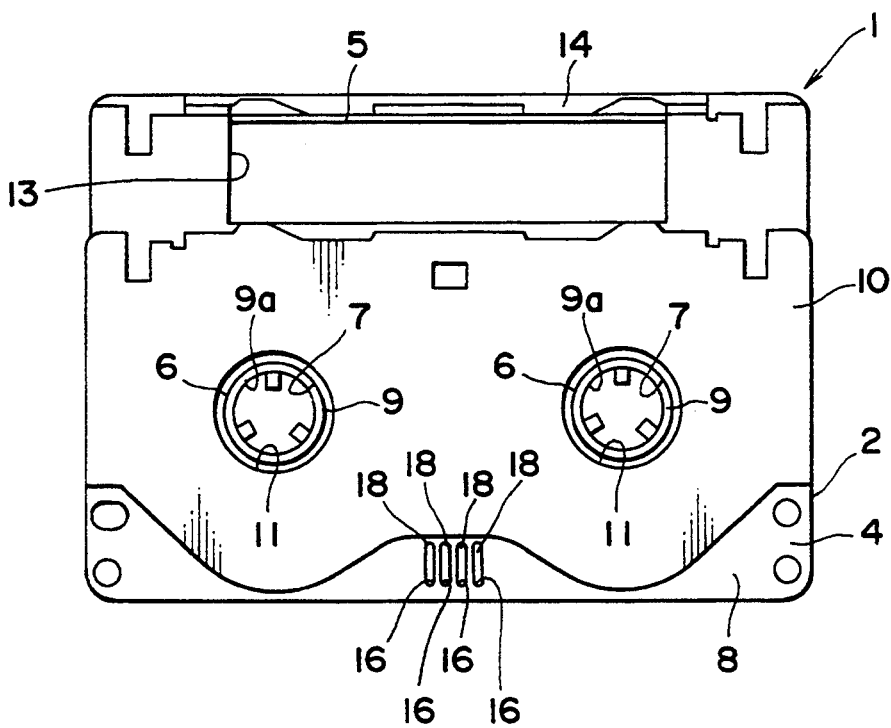
FIG. 2 is a bottom view of the small-sized video tape cassette of FIG. 1 in a state where the shutter is opened.
Figure 3:
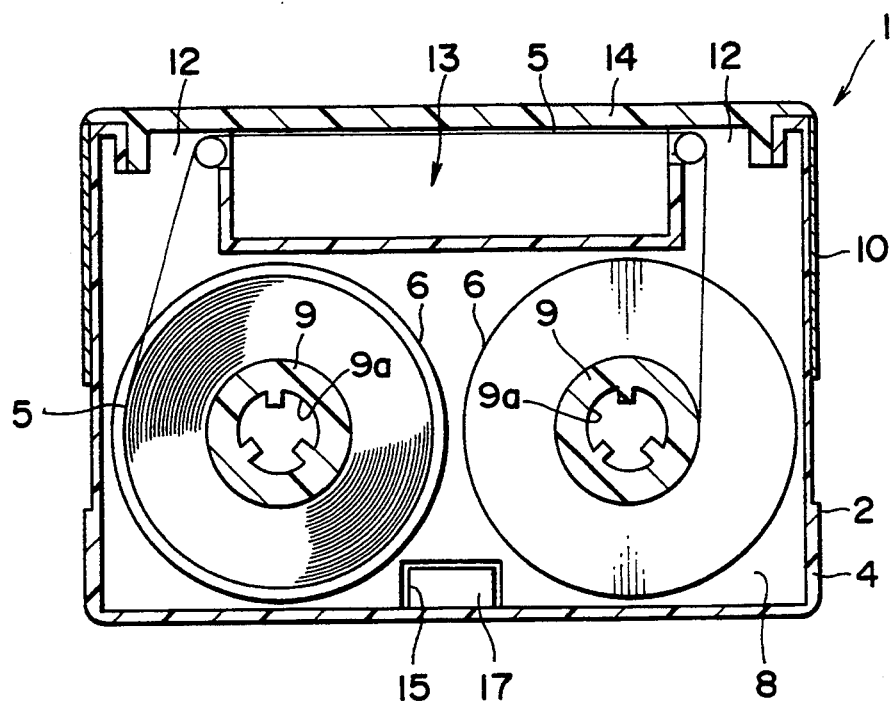
FIG. 3 is a horizontal sectional view of the small-sized video tape cassette of FIG. 1.
Figure 4:
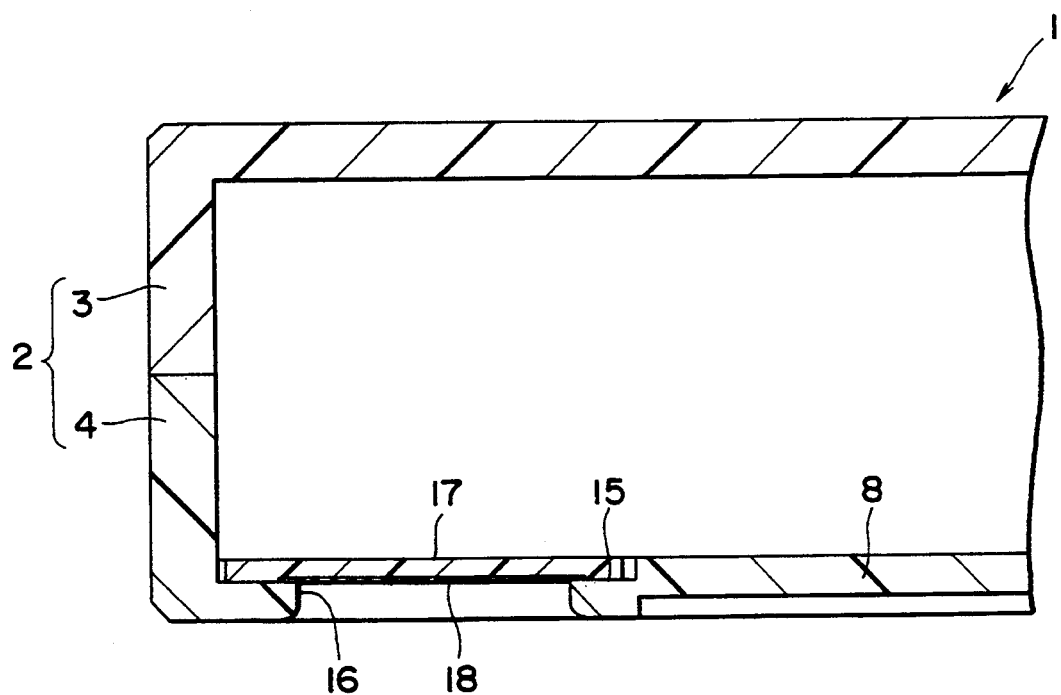
FIG. 4 is an enlarged sectional view of an essential portion of the video tape cassette of FIG. 1.

The present invention will be described as applied to a video tape cassette and to a VTR which uses the video tape cassette.

Referring to FIGS. 1 to 4, a small-sized video tape cassette 1 has a case 2 having a laterally elongate rectangular shape and formed by joining together a top half case 3 and a bottom half case 4. A pair of tape reels 6 are supported for rotation within the case 2, and a magnetic tape 5 having opposite ends fastened to the pair of tape reels 6 is held on the pair of tape reels 6. Formed in the bottom wall 8 of the case 2 are a pair of laterally spaced through holes 7 for receiving the bosses 9 of the tape reels 6 so that splined holes 9a formed in the bosses 9 are accessible from outside. A shutter 10 is supported slidably on the inner surface of the bottom wall 8 of the bottom half case 4. The shutter 10 is provided with a pair of laterally spaced through holes 11. When the shutter 10 is at its closed position, the through holes 11 thereof are dislocated from the through holes 7 of the case 2 to conceal the splined holes 9a of the tape reels 6. When the shutter 10 is shifted to its open position, the through holes 11 thereof coincide with the through holes 7, respectively, so that the splined holes 9a of the tape reels 6 are exposed through the through holes 7 and 11. Tape outlets 12 are formed in the front wall of the case 2 at positions near the opposite ends of the front wall of the case 2, respectively. A mouth 13 opening toward the front and downward is formed between the tape outlets 12 in the front portion of the case 2. A portion of the magnetic tape 5 extends between the tape outlets 12 along the front side of the mouth 13. A turning lid 14 is supported pivotally in the front portion of the case so as to cover the front side of the case 2. A shallow, rectangular recess 15 is formed in the inner surface of the bottom wall 8 of the case 2 at the middle of the rear portion of the bottom wall 8. Contact slots 6 are formed in the bottom wall 8 of the case 2 in the recess 15 in a lateral arrangement.

Figure 5:
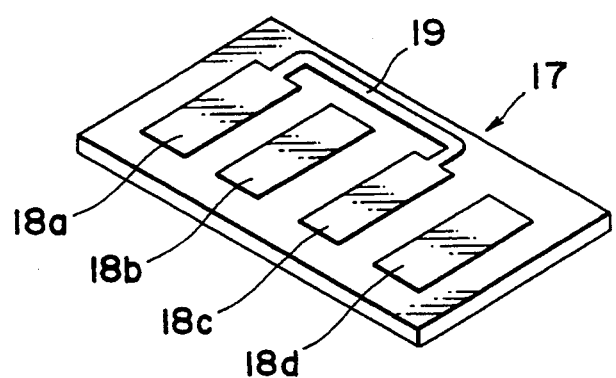
FIG. 5 is an enlarged perspective view of a printed wiring board.

Referring to FIG. 5, a printed wiring board 17 has a rectangular shape substantially exactly fitting the recess 15. Rectangular contacts 18, i.e., contacts 18a, 18b, 18c and 18d in this embodiment, are formed on the lower surface of the printed wiring board 17 in a lateral arrangement so that the contacts 18 coincide with the contact slots 16 of the case 2, respectively, when the printed wiring board 17 is fitted in the recess 15. The contacts 18 are gold-plated to secure durability and reliability. A wiring pattern 19 of a conductive material is formed on the lower surface of the printed wiring board 17. In this embodiment, the contacts 18a and 18c are interconnected by the wiring pattern.

The printed wiring board 17 is fitted in the recess 15 of the case 2 with its lower surface provided with the contacts 18a, 18b, 18c and 18d and the wiring pattern 19 facing down and fixed to the bottom wall 8 with an adhesive or by welding. When fixing the printed wiring board 17 to the bottom wall 8 of the case 2 by welding, pins (not shown) formed on the bottom surface of the recess 15 of the case 2 are inserted through holes formed in the printed wiring board 17, and then the protruding portions of the pins are hot-pressed.

To ensure the fixation of the printed wiring board 17 to the case 2, ribs (not shown) may be formed on the inner surface of the top half case 3 so that the ribs press down the printed wiring board 17 against the bottom surface of the recess 15 when the top half case 3 and the bottom half case 4 are joined together.

Figure 6:
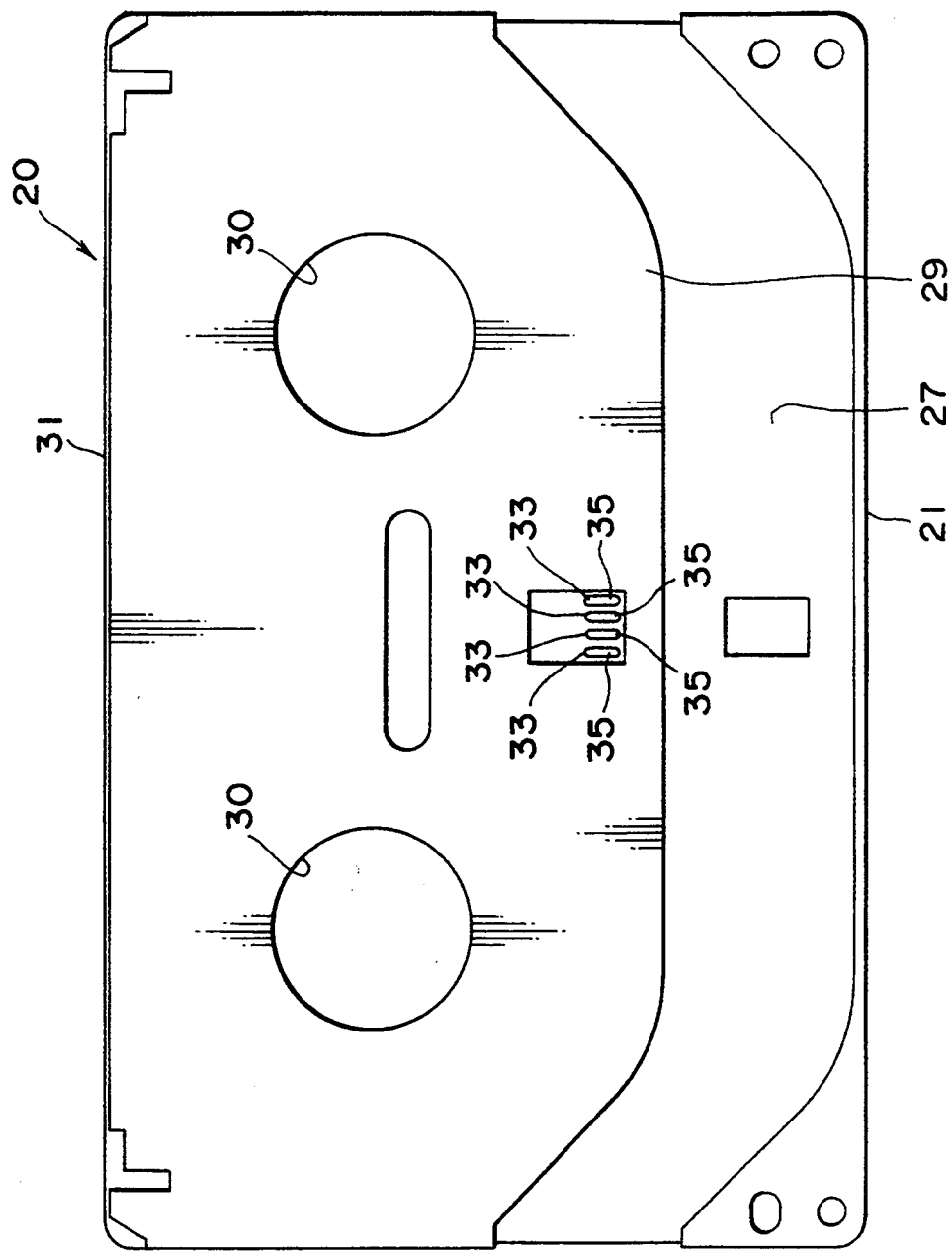
FIG. 6 is a bottom view of a video tape cassette in a preferred embodiment according to the present invention in a state where the shutter thereof is closed.
Figure 7:
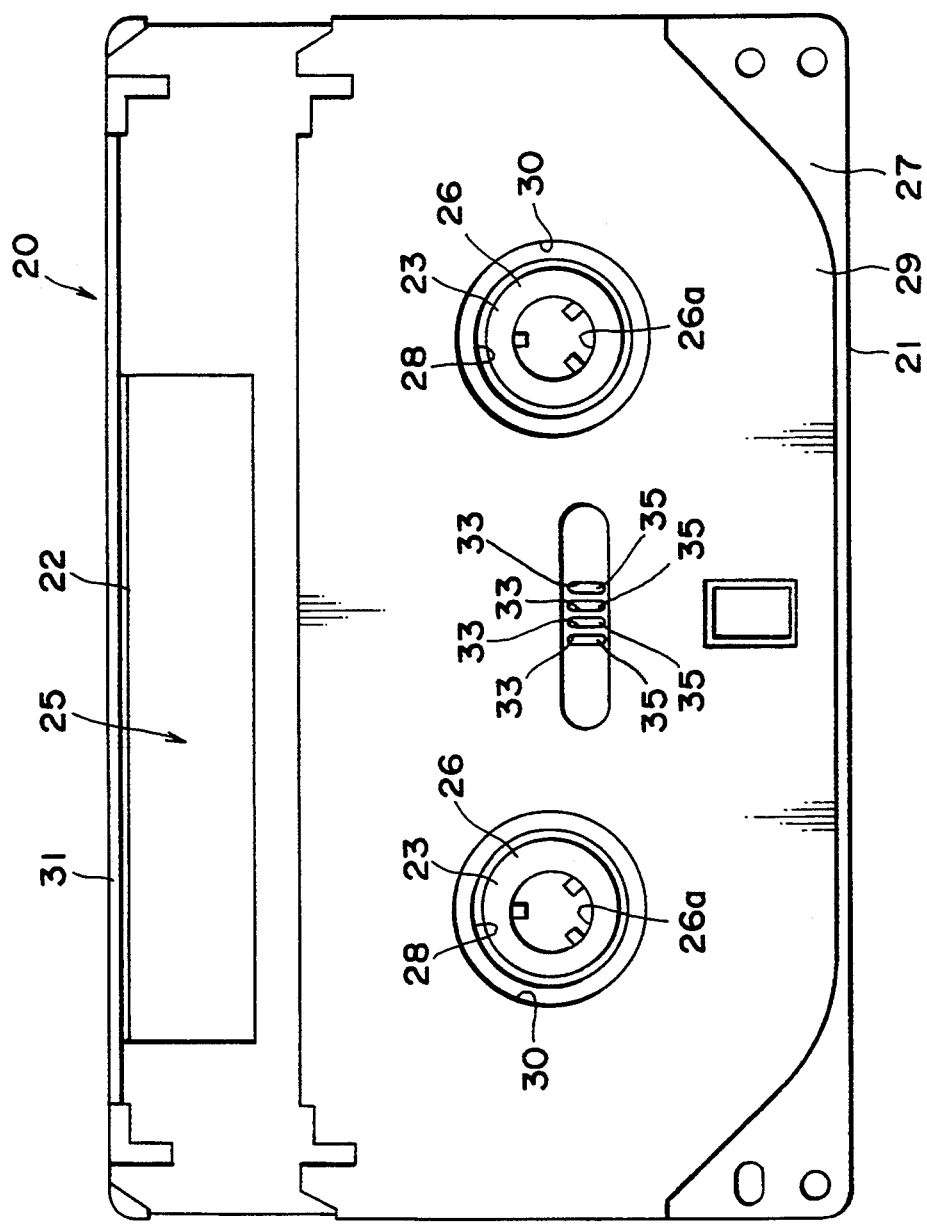
FIG. 7 is a bottom view of the video tape cassette of FIG. 6 in a state where the shutter is opened.
Figure 8:
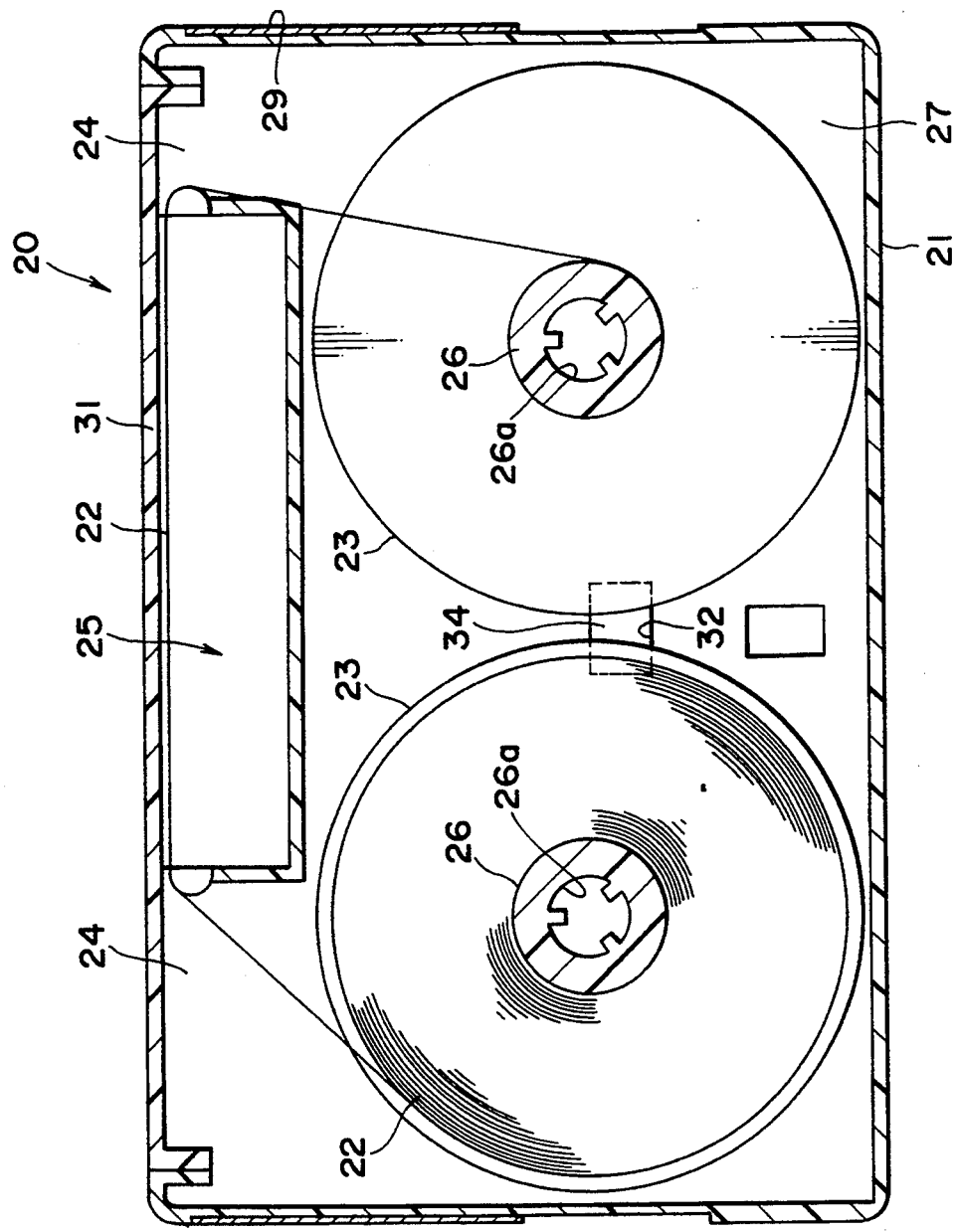
FIG. 8 is a horizontal sectional view of the video tape cassette of FIG. 6.
Figure 9:
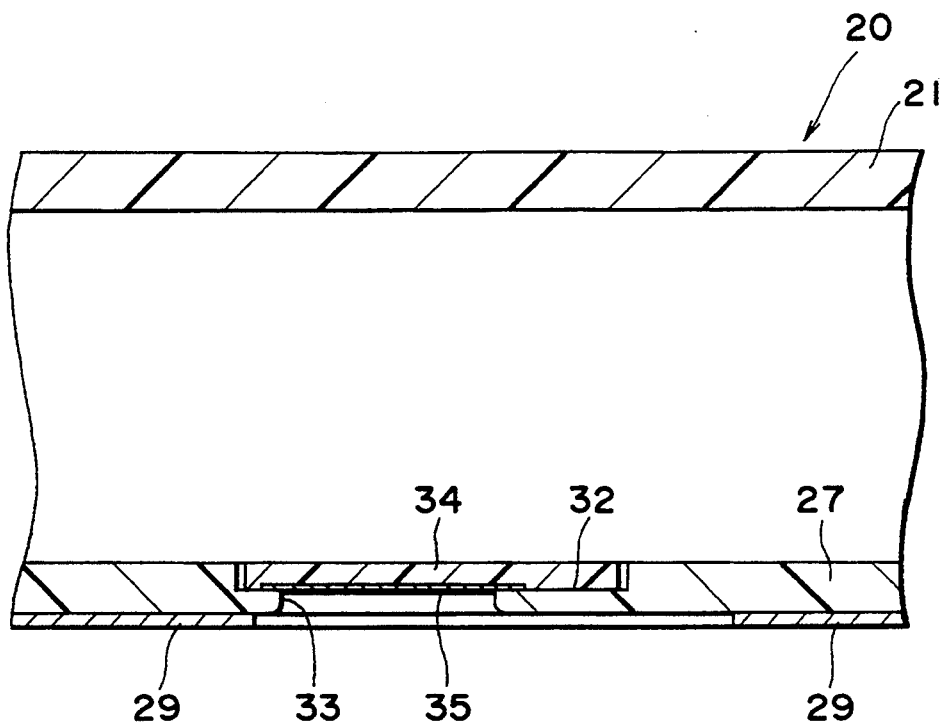
FIG. 9 is an enlarged sectional view of an essential portion of the video tape cassette of FIG. 6.
Figure 10:
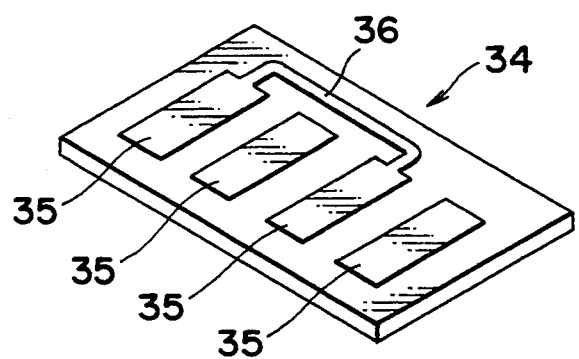
FIG. 10 is an enlarged perspective view of a printed wiring board provided with information indicating contacts.

Referring to FIG. 6, a large-sized tape cassette 20, which is larger than the small-sized tape cassette 1, is substantially the same in construction as the small-sized tape cassette 1, except that the large-sized tape cassette 20 is provided with a printed wiring board at a position different from that of the printed wiring board 17 of the small-sized tape cassette 1.

The large-sized tape cassette 20 has a case 21 having the shape of a laterally elongate, rectangular, flat box. A pair of tape reels 23 are supported for rotation within the case 21, and a magnetic tape 22 is held on the tape reels 23. A portion of the magnetic tape 22 extends between tape outlets 24 along the front side of a mouth 25.

Splined holes 26a formed in the bosses 26 of the reels 23 are accessible from outside through through holes 28 formed in the bottom wall 27 of the case 21, and through holes 30 formed in a shutter 29 when the shutter 29 is at its open position. The front side of the case 21 is covered with a lid 31.

A shallow recess 32 is formed in the inner surface of the bottom wall 27 of the case 21 at a position slightly to the rear from the central portion of the inner surface of the bottom wall 27. The recess 32 is substantially the same in size and depth as the recess 15 of the small-sized tape cassette 1. Contact slots 33 are formed in the bottom wall 27 of the case 21 in the recess 32.

A printed wiring board 34, which is substantially identical with the printed wiring board 17, is provided with contacts 35 and a wiring pattern 36 of a conductive material on its lower surface. The printed wiring board 34 is fixedly fitted in the recess 32 with its lower surface facing down and with the contacts 35 coinciding respectively with the contact slots 33.

Figure 16:
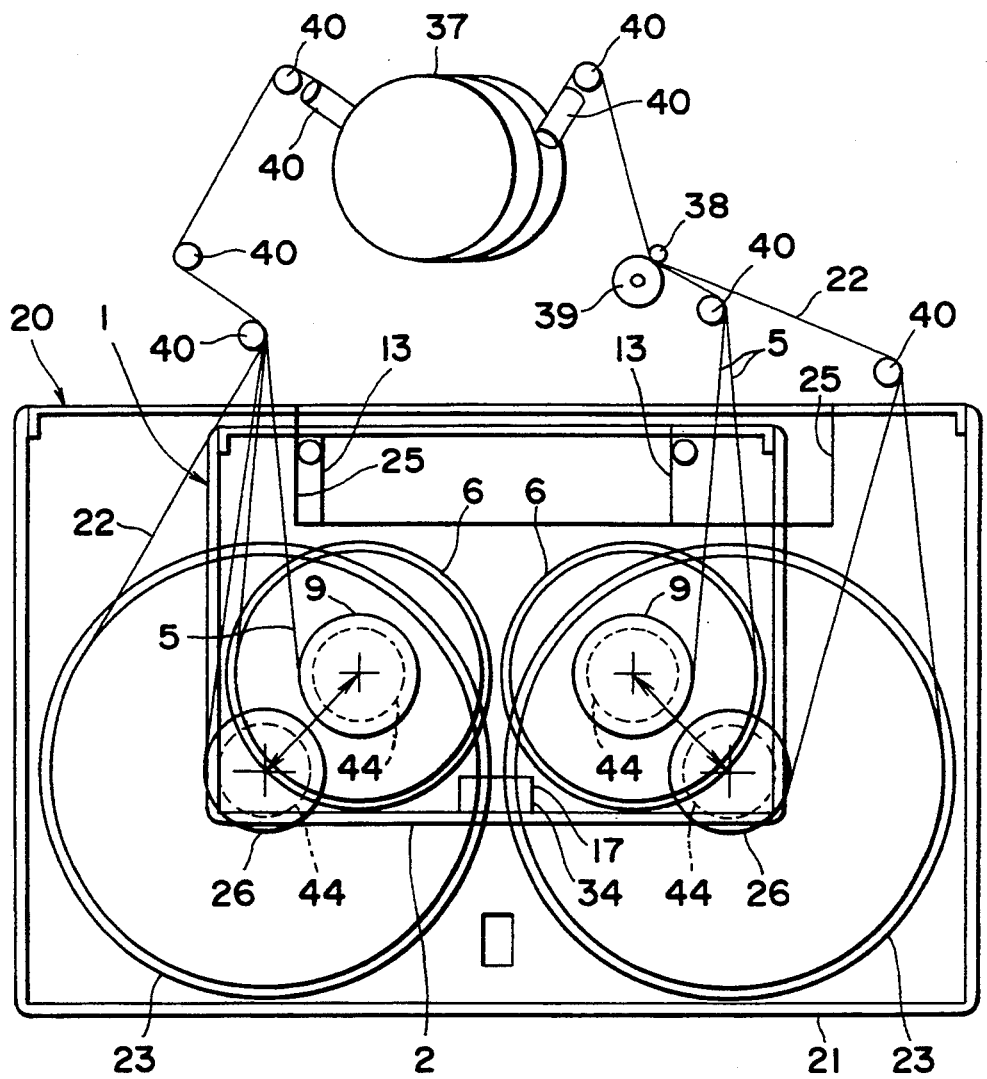
FIG. 16 is a plan view of the recording/reproducing apparatus of FIG. 11, in which a large-sized video tape cassette and a small-sized video tape cassette are superposed hypothetically one over the other on the recording/reproducing apparatus.

As shown in FIG. 16, in which the small-sized tape cassette 1 and the large-sized tape cassette 20 are superposed hypothetically one over the other on a VTR 41 (see FIG. 11) designed for using either of the small-sized tape cassette 1 or the large-sized tape cassette 20, the respective mouths 13 and 25 of the tape cassettes 1 and 20 coincide with each other. Therefore, VTR 41 needs a single set of tape operating system and the arrangement and operation of the component members of the tape operating system of the VTR 41 are simple. In FIG. 16, there are shown a magnetic head cylinder 37, a capstan 38, a pinch roller 39 and guide rollers 40.

Thus, the position of the mouth 13 of the small-sized tape cassette 1 in the VTR 41 and that of the mouth 25 of the large-sized tape cassette 20 in the VTR 41 coincide with each other, and the positions of the contacts 18 of the printed wiring board 17 of the small-sized tape cassette 1 in the VTR 41 and those of the contacts 35 of the printed wiring board 34 of the large-sized tape cassette 20 in the VTR 41 coincide with each other.

An information detecting system for detecting pieces of information indicated by the contacts 18 or 35 will be described hereinafter.

Figure 11:
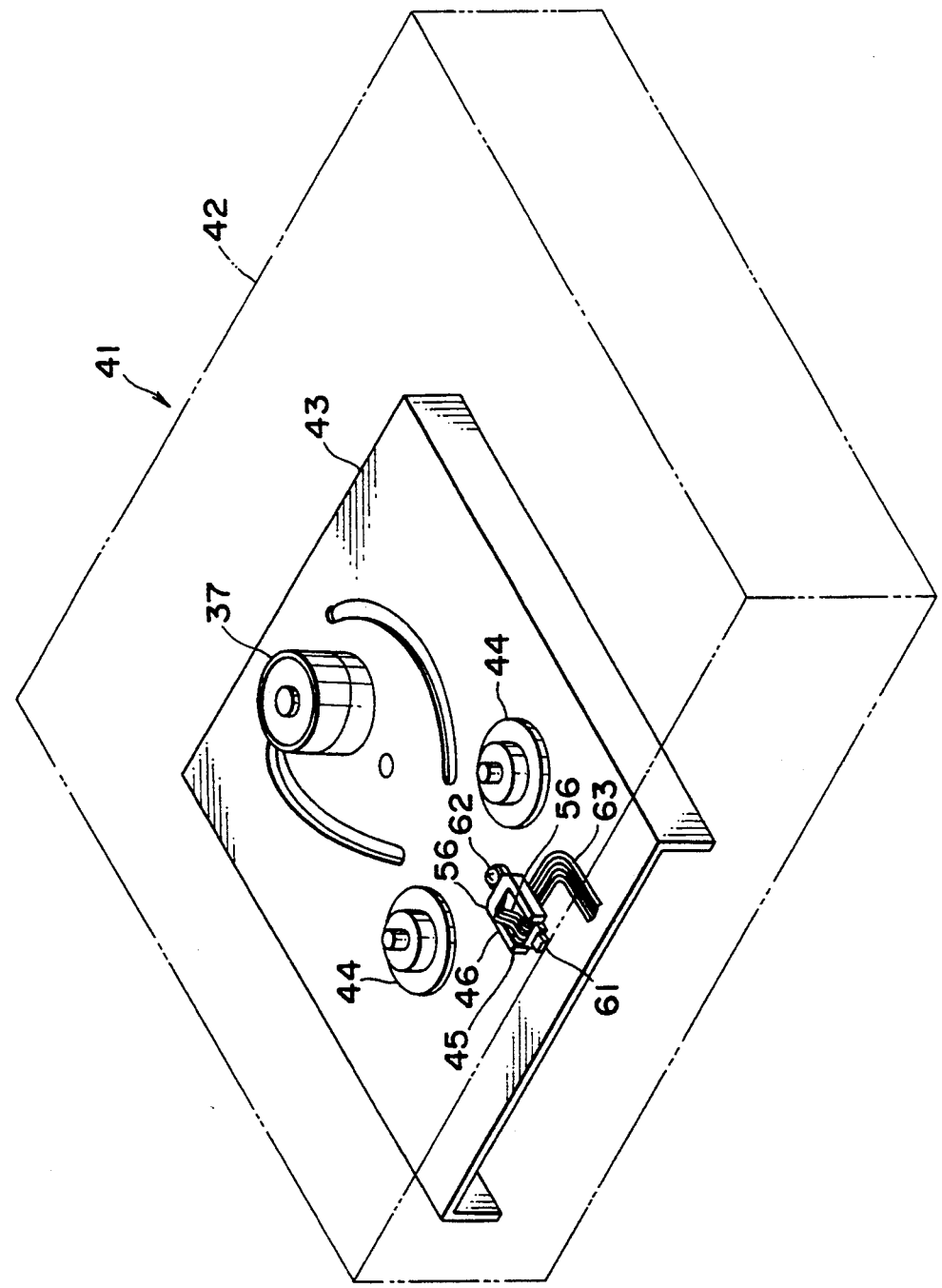
FIG. 11 is a schematic perspective view of a recording/reproducing apparatus in a preferred embodiment according to the present invention.

Referring to FIGS. 11 and 16, the VTR 41 has a cabinet 42, a mechanical chassis 43 disposed within the cabinet 42, mechanical components including the magnetic head cylinder 37 and reel tables 44 are mounted on the mechanical chassis 43, and a connector 45 fixedly disposed on the mechanical chassis 43 at a position corresponding to the contacts 18 (35). As indicated by the arrows in FIG. 16, the reel tables 44 are shifted between positions for supporting the reels 6 of the small-sized tape cassette 1 and positions for supporting the reels 23 of the large-sized tape cassette 20.

Figure 12:
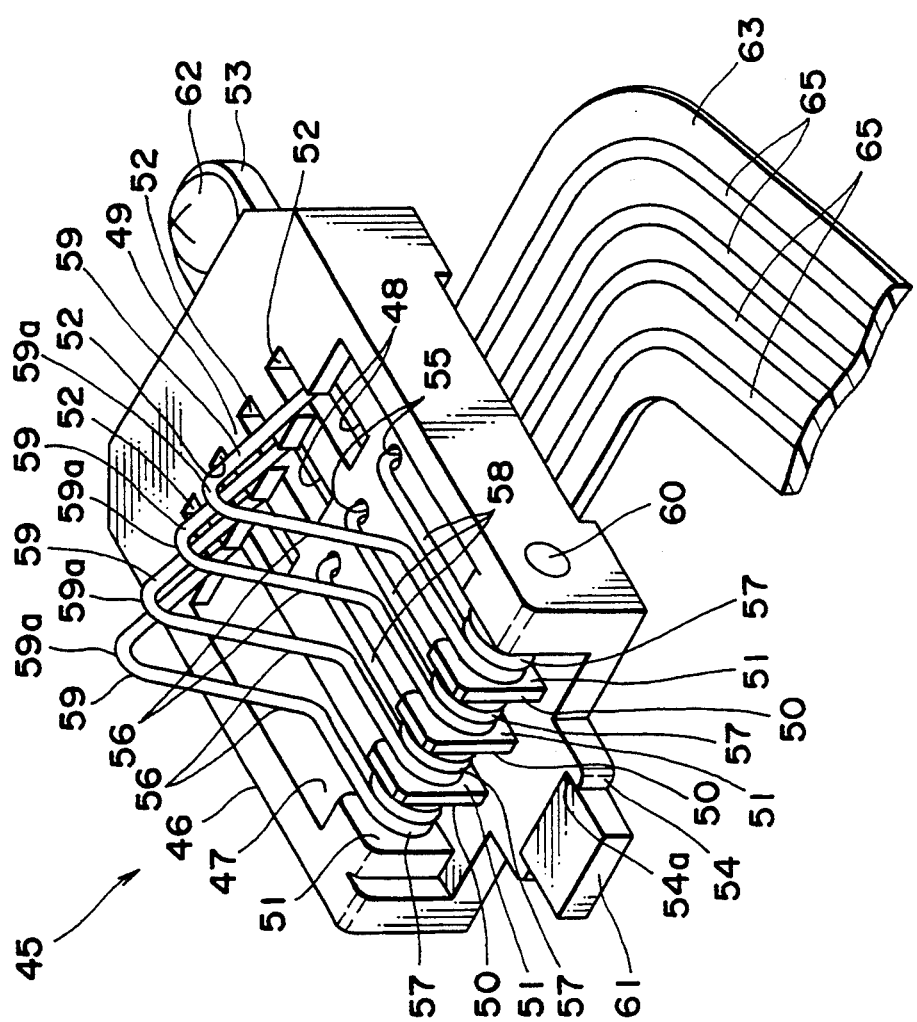
FIG. 12 is an enlarged perspective view of a connector serving as an information detecting means.
Figure 13:
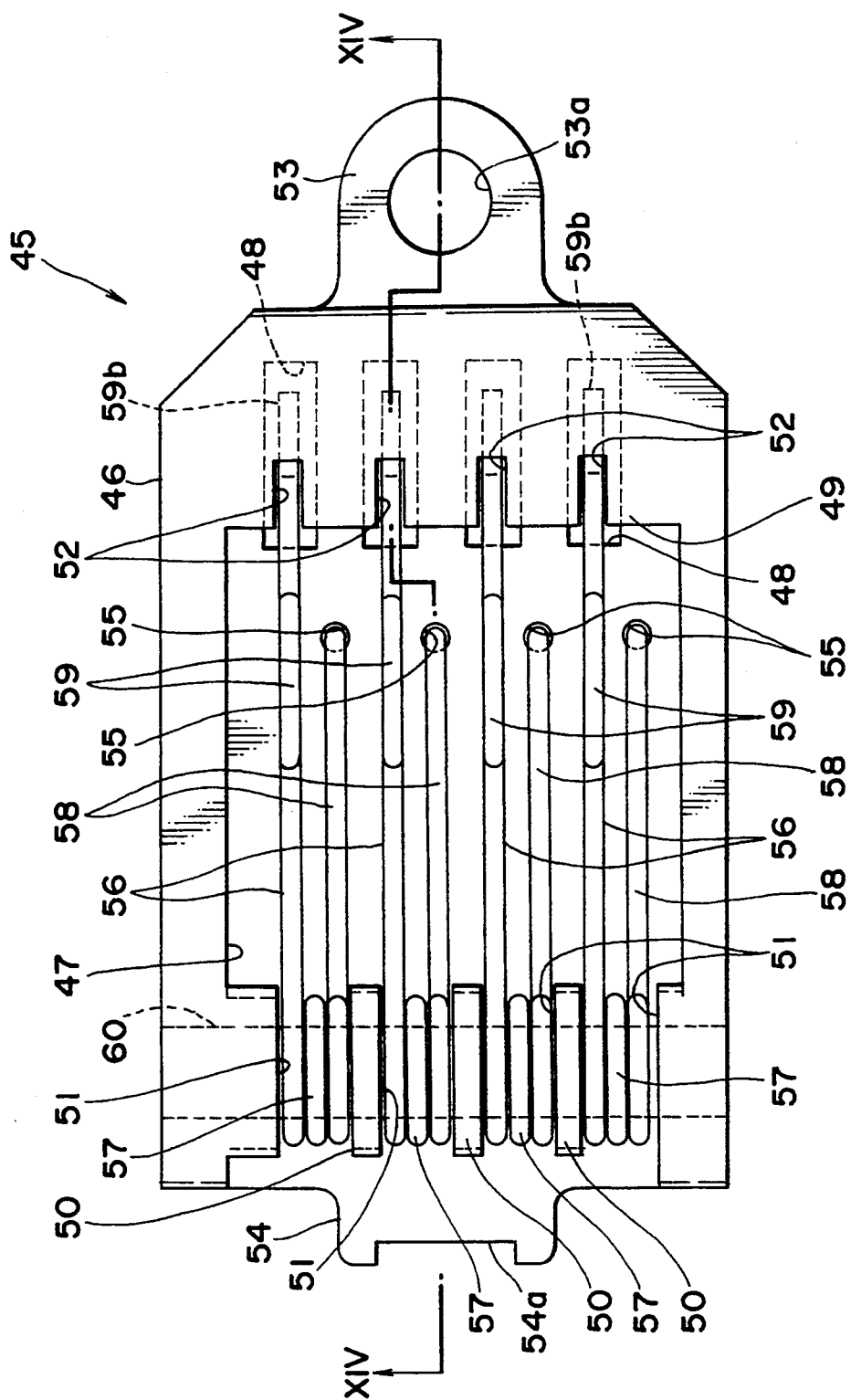
FIG. 13 is a plan view of the connector of FIG. 12.
Figure 14:
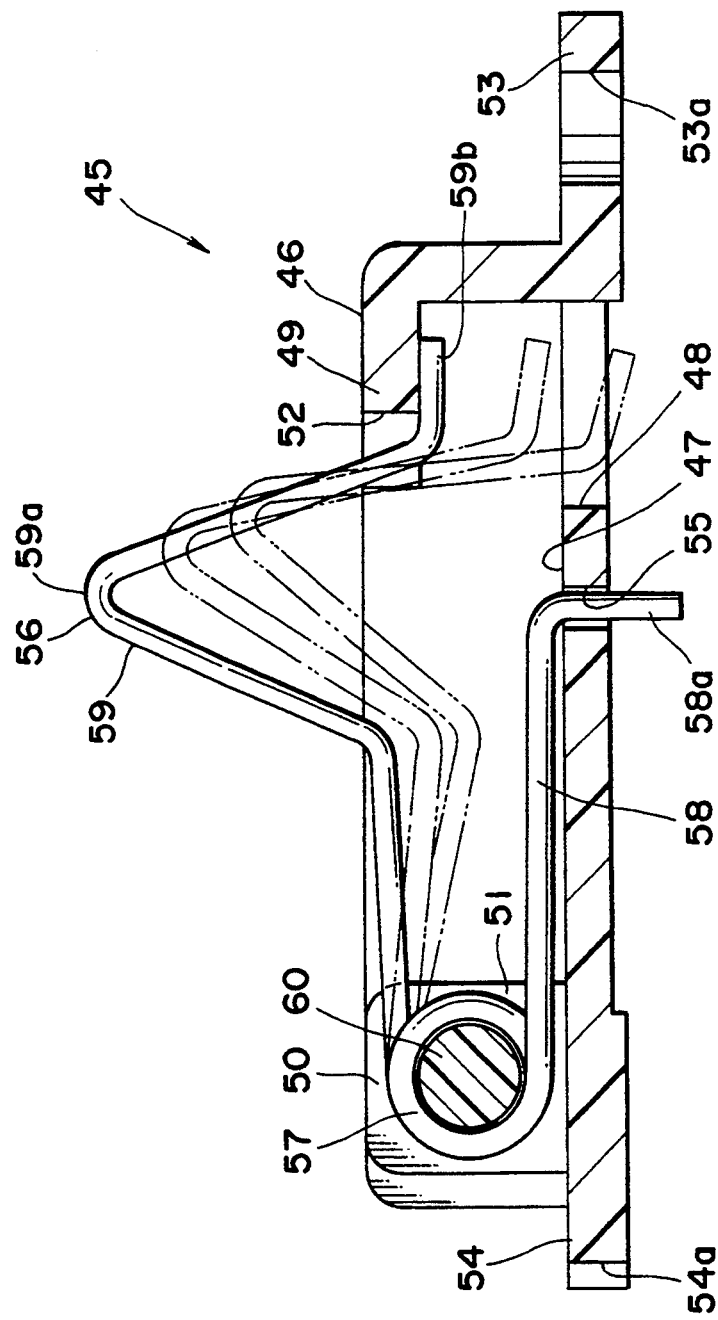
FIG. 14 is a sectional view taken on line XIV—XIV in FIG. 13.

Referring to FIGS. 12 and 13, the connector 45 comprises a casing 46, detecting contacts 56 and a shaft 60 pivotally supporting the detecting contacts 56 on the casing 46.

The casing 46 is formed of an insulating material, such as a synthetic resin, and is provided with a recess 47 opening upward and backward. Grooves 48 are formed in the front portion of the bottom surface of the recess 47 to form an overhang 49 at the front end of the recess 47. Support walls 50 are arranged laterally at regular intervals along the rear end of the recess 47 to form spaces 51 therebetween and the side walls of the recess 47 and the support walls 50. Positioning recesses 52 are formed in the overhang 49 at positions respectively corresponding to the spaces 51. An attaching lug 53 provided with a through hole 53a projects from the middle of the front end of the casing 46, and a positioning lug 54 provided with a recess 54a opening rearward projects rearward from the middle of the rear end of the casing 46. Through holes 55 are formed in the lower wall of the casing 46 at positions between the spaces 51 and the positioning recesses 52, respectively.

The detecting contacts 56 are formed by bending a conductive spring wire in the shape of a torsion coil spring. Each detecting contact 56 has a coil portion 57, a lower arm 58 and an upper arm 59. The free end of the lower arm 58 is bent down at right angles to form a connecting end 58a. The front portions of the upper arms 59 are bent down in the shape of an inverted letter V to form contact portions 59a. The extremities 59b of the upper arms 59 extend substantially horizontally.

The coil portions 57 of the detecting contacts 56 are fitted in the spaces 51 of the casing 46 with the lower arms 58 extended along the bottom surface of the recess 47 of the casing 46 and the extremities of the connecting portions 58a projecting downward from the bottom surface of the casing 46. The extremities of the contact portions 59a of the upper arms 59 are vertically movable in the positioning recess 52. The extremities 59b of the upper arms 59 underlie portions of the lower surface of the overhang 49 in front of the front ends of the positioning recess 52. Since the coil portions 57 are held in place and the upper arms 59 tend to turn upward when not depressed, the extremities 59b of the upper arms 59 are held in contact with the lower surface of the overhang 49 to determine the vertical position of the upper arms 59.

The detecting contacts 56 are thus arranged on the casing 46, and the shaft 60 is inserted through the rear ends of the opposite side walls of the recess 47, the support walls 50 and the coil portions 57 of the detecting contacts 56 and fixed to the casing 46 to support the detecting contacts 56 on the casing 46.

The connector 45 thus formed is placed on the mechanical chassis 43 with the recess 54a of the positioning lug 54 in engagement with a positioning projection 61 formed on the mechanical chassis 43 and is fixed to the mechanical chassis 43 with a screw 62 through the through hole 53a of the attaching lug 53 in the mechanical chassis 43.

The connector 45 is connected to a microcomputer 64 by a flexible printed wiring board 63. The connecting portions 58a of the detecting contacts 56 are connected to the conductors 65 of the flexible printed wiring board 63, respectively.

When the tape cassette 1 (20) is placed on the cassette holder, not shown, of the VTR 41, and the tape cassette 1 (20) is lowered as far as the splined holes 9a (26a) of the tape reels 6 (23) engage the reel tables 44, the upper ends of the contact portions 59a of the detecting contacts 56 of the connector 45 come into contact with the terminals 18 (35) of the tape cassette 1 (20). When depressed by the lowering tape cassette 1 (20), the upper arms 59 of the detecting contacts 56 are flexed downward, the extremities 59b of the upper arms 59 are separated from the lower surface of the overhang 49 of the casing 46, and the upper ends of the upper arms 53 move slightly forward and come into contact with the contacts 18 (35). Thus, the upper ends of the contact portions 59a are in resilient contact with the contacts 18 (35).

Figure 15:
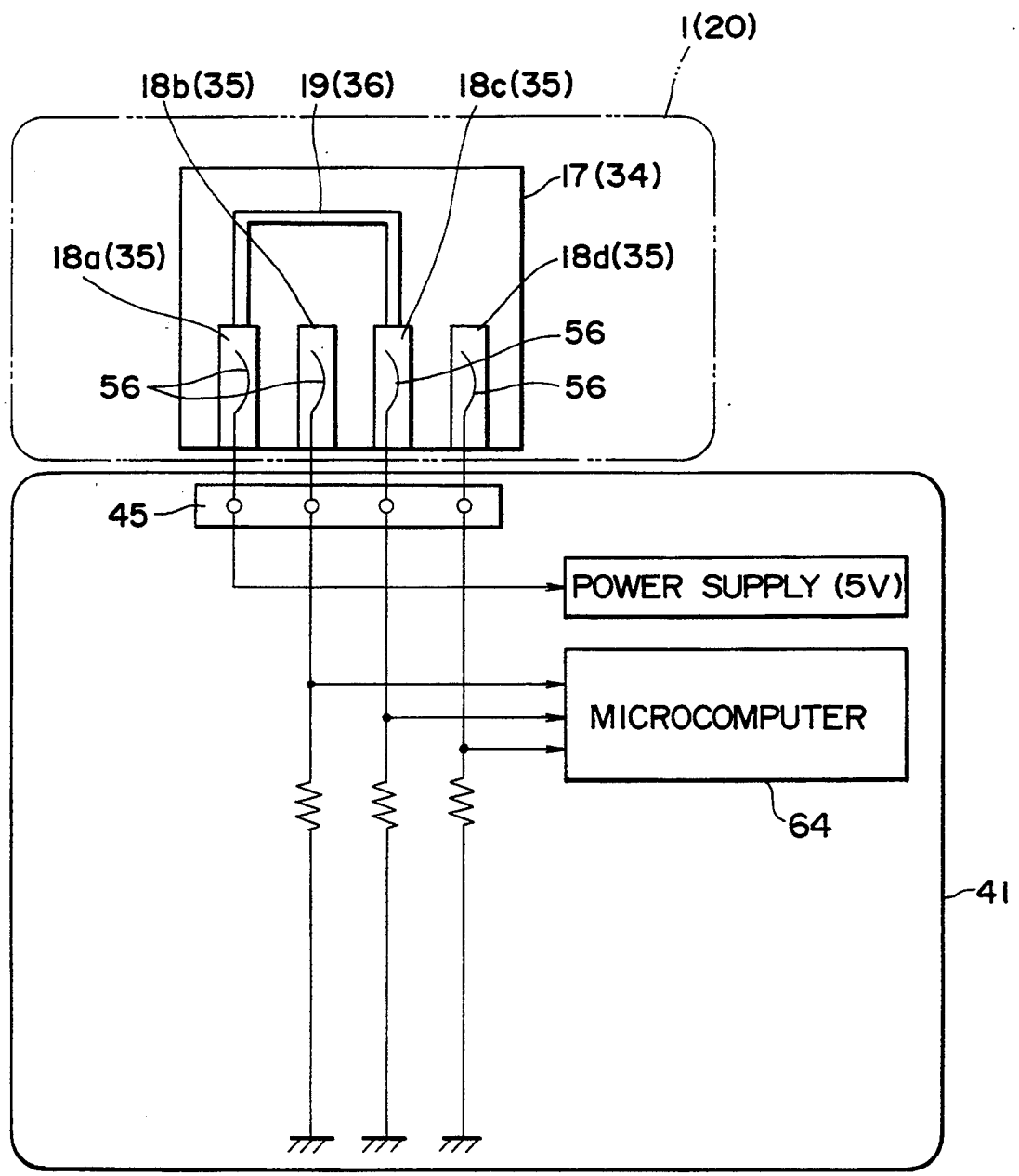
FIG. 15 is a connection diagram of an information reading system.

Then, as shown in FIG. 15, a supply voltage is applied, for example, to the contact 18a (35a), and a three-bit signal produced by the contacts 18b, 18c and 18d (35b, 35c and 35d) is sent to the microcomputer 64. In this embodiment, since only the contact 18c is connected to the contact 18a by the wiring pattern 19, the three-bit signal is [0 1 0]. Thus, eight three-bit signals from [0 0 0] to [1 1 1] can be produced by selectively connecting the contacts 18b, 18c and/or 18d (35b, 35c and/or 35d) and the contact 18a (35a).

Figure 17:
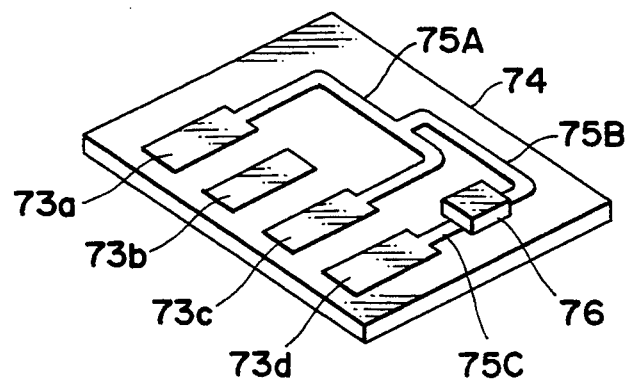
FIG. 17 is an enlarged perspective view of a printed wiring board provided with information indicating contacts employed in a video tape cassette in another embodiment according to the present invention.
Figure 18:
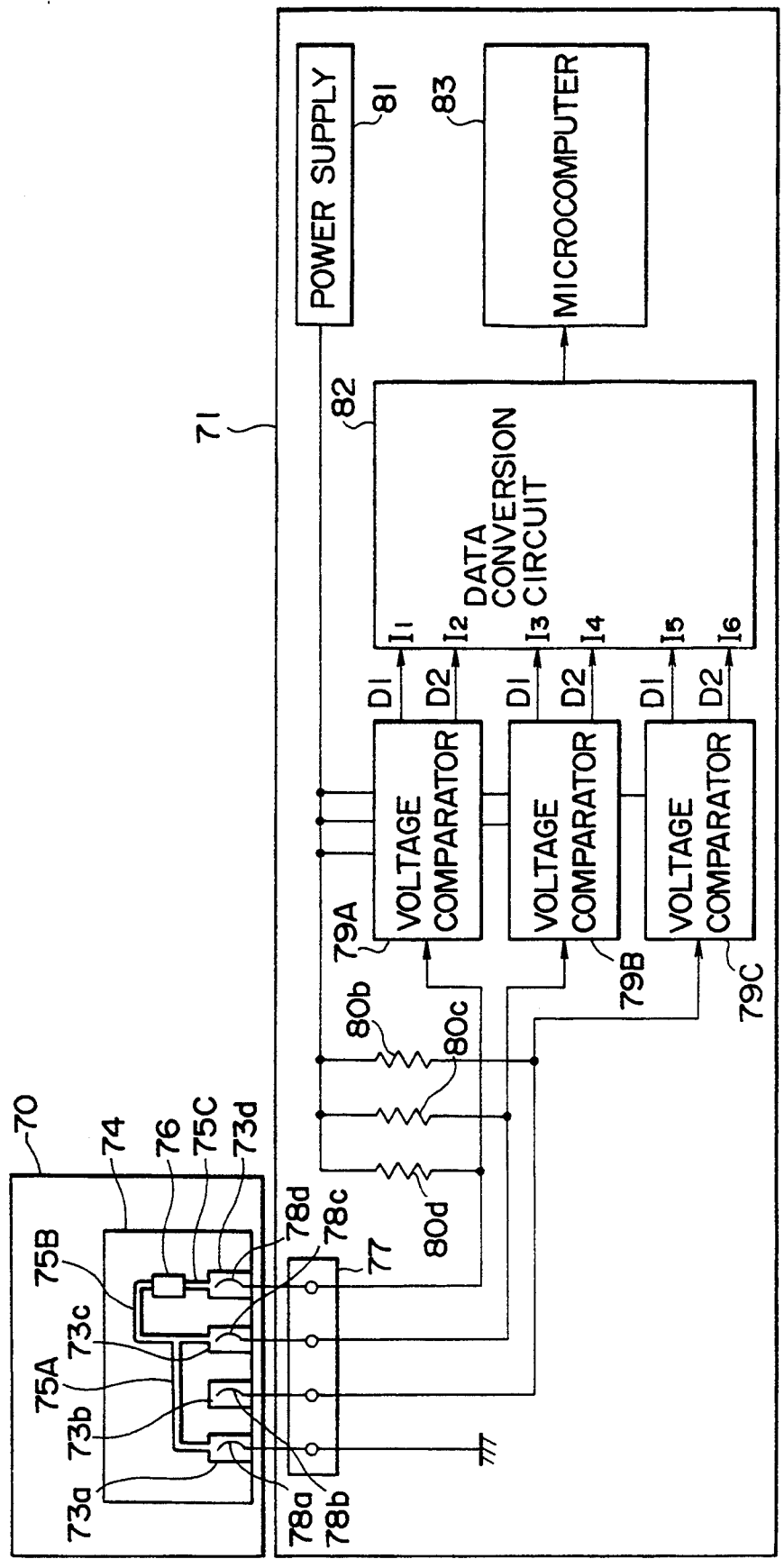
FIG. 18 is a block diagram of an information reading system for reading information indicated by the information indicating contacts of the printed wiring board of FIG. 17.
Figure 19:
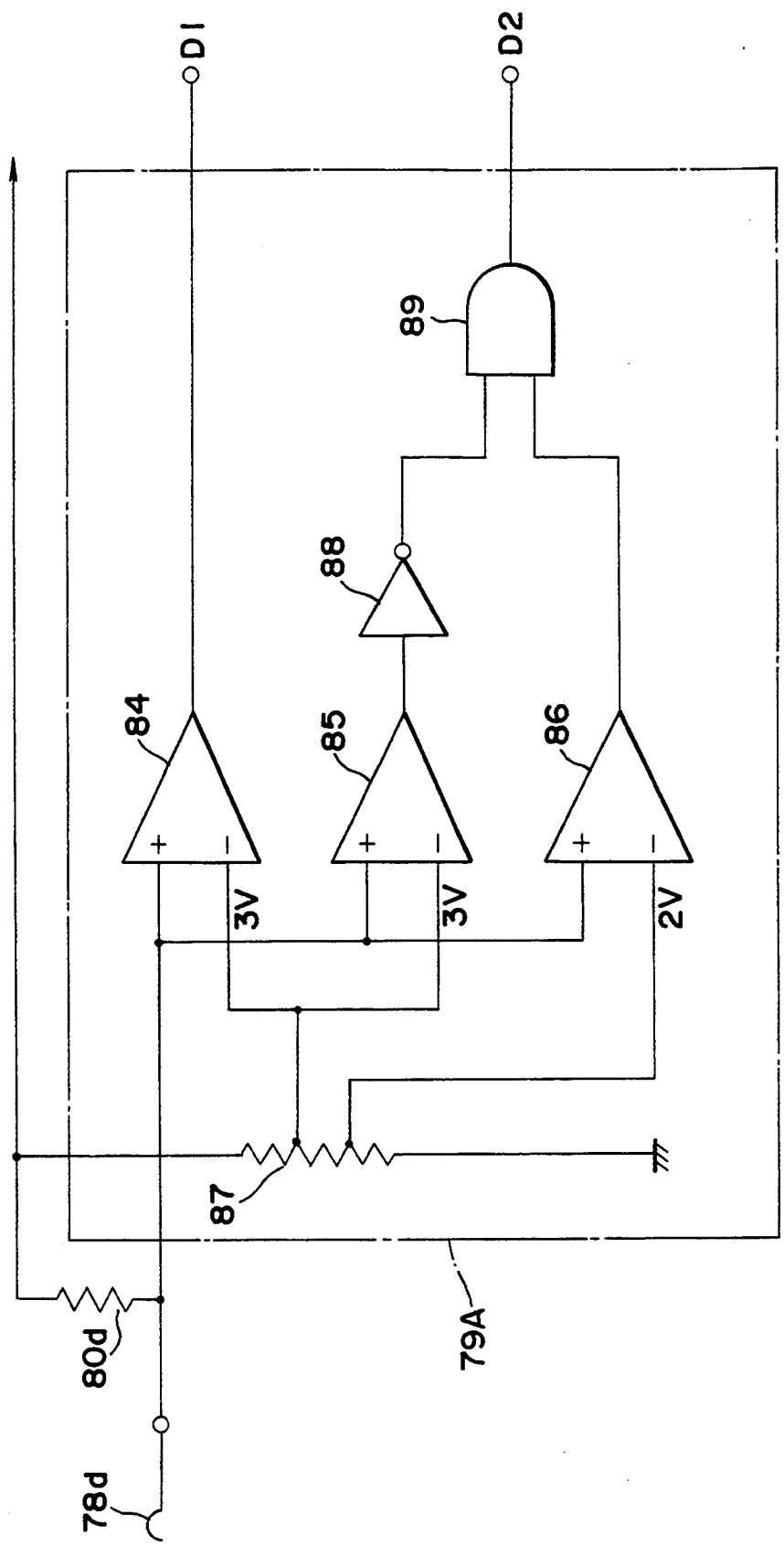
FIG. 19 is a circuit diagram of a voltage comparator included in the recording/reproducing apparatus of FIG. 11.

A tape cassette 70 and a VTR 71 embodying the present invention in FIGS. 17 to 19, in which parts like or corresponding to those of the first embodiment are denoted by the same reference characters and the description thereof will be omitted.

In the first embodiment, each of the contacts 18b (35b), 18c (35c) and 18d (35d) is connected or not connected to the contact 18a (35a) to make the same to represent "0" or "1". The second embodiment employs a printed wiring board 74 provided with contacts 73a, 73b, 73c and 73d which are kept open, short-circuited or connected through a resistor to a ground to represent three states by each of the contacts 73a, 73b, 73c and 73d.

Referring to FIG. 17, showing the connection of the contacts 73a, 73b, 73c and 73d of the printed wiring board 74 by way of example, the contact 73a is connected to the contact 73c by a conductor 75A and through a conductor 75B, a chip resistor 76 and a conductor 75C to the contact 73d. Thus, the contacts 73a and 73c are short-circuited, the chip resistor 76 is interposed between the contacts 73a and 73d, and the contacts 73a and 73b separated from each other. The printed wiring board 74, similarly to the printed wiring boards 17 and 34, is fixedly fitted in the recess 15 (32) of the case 2 (21).

Referring to FIG. 18 showing the connection of the contacts 73a, 73b, 73c and 73d of the printed wiring board 74 and the detection circuit of the VTR 71, the contacts 73a, 73b, 73c and 73d of the printed wiring board 74 are brought into contact respectively with the detecting contacts 78a, 78b, 78c and 78d of a connector 77 included in the VTR 71 when the tape cassette 70 is inserted in the VTR 71.

The contact 73d is connected through the detecting contact 78d to the input terminal of a voltage comparator 79A, and through a resistor 80d to the output terminal of a power supply 81. The contact 73c is connected through the detecting contact 78c to the input terminal of a voltage comparator 79B and through a resistor 80c to the output terminal of the power supply 81. The contact 73b is connected through the detecting contact 78b to the input terminal of a voltage comparator 79C, and through a resistor 80b to the output terminal of the power supply 81. The contact 73a is connected through the detecting contact 78a to a ground.

The voltage comparators 79A, 79B and 79C detect the respective potentials of the detecting contacts 78b, 78c and 78d, respectively, and determine detection ranges in which the potentials of the corresponding detecting contacts 78b, 78c and 78d fall, and give either of two binary signals D1 and D2 representing the detection ranges through a data conversion circuit 82 to a microcomputer 83.

The voltage comparators 79A, 79B and 79c are identical in configuration and hence only the voltage comparator 79A will be described.

Referring to FIG. 19, the voltage comparator 79A comprises three comparators 84, 85 and 86, a resistor 87, a NOT gate 88 and an AND gate 89. The potential of the directing contact 78d is applied to the positive input terminals of the comparators 84 and 85. A reference voltage, for example, about 3 V, obtained by dividing the supply voltage, for example, 5 V, of the power supply 81 by the resistor 87 is applied to the negative input terminals of the comparators 84 and 85. The output signal D1 of the comparator 84 appears at a terminal, the output signal of the comparator 85 is applied to the input terminal of the NOT gate 88, and the output signal of the NOT gate 88 is given to the AND gate 89.

The potential of the detecting contact 80d is applied to the positive input terminal of the comparator 86, a reference voltage lower than the reference voltage for the comparators 84 and 85, for example, about 2 V, obtained by dividing the supply voltage by the resistor 87 is applied to the negative input terminal of the comparator 86, and the output signal of the comparator 86 is applied to the AND gate 89.

The AND gate 89 receives the signal provided by the comparator 85 through the NOT gate 88 and the output signal of the comparator 86, processes the input signals by an AND operation, and provides a signal D2 obtained by the AND operation.

When the potential of the detecting contact 78d is not lower than the reference voltage for the comparators 84 and 85, i.e., in the range of 3 to 5 V, the output signals of the comparators 84 and 85 goes HIGH and, consequently, the signal D1 goes HIGH. When the output signal of the comparator 85 is HIGH, the output of the NOT gate 88, i.e., the complement of the input signal, applied to the AND gate 89 goes LOW and, consequently, the signal D2 goes LOW.

When the potential of the detecting contact 78d is not higher than the reference voltages for the comparators 84 and 85 and not lower than the reference voltage for the comparator 86, i.e., in the range of 2 to 3 V, the output signals of the comparators 84 and 85 goes LOW and hence the signal D1 goes LOW. Since the output signal of the NOT gate 88, i.e., the complement of the output signal LOW of the comparator 85, is HIGH and the output signal of the comparator 86 is HIGH, the signal D2 goes HIGH.

When the potential of the detecting contact 78d is not higher than the reference voltage of the comparator 86, i.e., in the range of 0 to 2 V, all the output signals of the comparators 84, 85 and 86 go LOW and, consequently, both the signals D1 and D2 go LOW. Thus, three states can be indicated by the combinations of the signals D1 and D2.

When the resistances of the resistors 80b, 80c and 80d and the chip resistor 76 shown in FIG. 18 are equal to each other, the potential of the detecting contact 78d is 2.5 V and hence the output signals D1 and D2 of the voltage comparator 79A are LOW and HIGH, respectively.

Since the potential of the detecting contact 78c is 0 V, both the output signals D1 and D2 of the voltage comparator 79B are LOW. Since the potential of the detecting contact 78b is 5 V, the output signals D1 and D2 of the voltage comparator 79C are HIGH and LOW, respectively.

The output signals D1 and D2 of the voltage comparators 79A, 79B and 79C are applied to the input terminals $I_1$ to $I_6$ of the data conversion circuit 82, and then the data conversion circuit 82 converts these input signals representing parallel data into corresponding serial data and gives the serial data to the microcomputer 83.

Then, the microcomputer 83 processes the serial data to determine the type of the tape cassette, the length and type of the tape and the like on the basis of the serial data.

Although this embodiment uses three kinds of state of each of the three contacts in combination to indicate $3^3$ kinds of state, generally, N to M power pieces of information can be indicated by using M contacts and a detecting circuit capable of detecting N kinds of state of each of the M contacts.

Although the printed wiring board provided with the contacts is disposed on the bottom wall of the case of the tape cassette in the foregoing embodiments, the printed wiring board may be placed on the rear wall, side wall or top wall of the case of the tape cassette.

Although the invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. A recording medium cassette having a case containing a recording medium and a plurality of information indicating contacts, said case having at least one slot and a recess formed in a wall of said case, said information indicating contacts are formed on a printed wiring board which is arranged in said recess such that said information indicating contacts are positioned so as not to extend beyond an outer surface of said wall of said case and are accessible through said at least one slot from outside said recording medium cassette.

2. A recording medium cassette according to claim 1, wherein said recording medium is a magnetic tape, and the magnetic tape is held on tape reels rotatably supported in the case.

3. A recording medium cassette according to claim 1, wherein one specified information indicating contact among the information indicating contacts is connected to some of the rest of the information indicating contacts.

4. A recording medium cassette according to claim 1, wherein one specified information indicating contact among the information indicating contacts is isolated from at least some of the rest of the information indicating contacts.

5. A recording medium cassette to be used on a recording and/or reproducing apparatus designed to use both the recording medium cassette and a small-sized recording medium cassette smaller in size than the former, provided with a mouth across which a portion of a recording medium held in a case thereof is extended, and information indicating means which is the same in size and construction as that included in the small-sized recording medium cassette, characterized in that the recording medium cassette is capable of being inserted in the recording and/or reproducing apparatus and of being positioned in the recording and/or reproducing apparatus with the mouth thereof positioned at a position where the mouth of the small-sized recording medium cassette is to be positioned when the small-sized recording medium cassette is inserted in the recording and/or reproducing apparatus and positioned in the same, and with the information indicating means thereof positioned at a position where the information indicating means of the small-sized recording medium cassette is to be positioned when the small-sized recording medium cassette is inserted in the recording and/or reproducing apparatus and positioned in the same, said information indicating means having a plurality of information indicating contacts formed on a printed wiring board which is arranged in a recess of a wall of the case such that the information indicating contacts are positioned so as not to extend beyond an outer surface of the wall of the case and are accessible from the outside through at least one slot in the case.

6. A recording medium cassette according to claim 5, wherein said recording medium is a magnetic tape, and the magnetic tape is held on tape reels rotatably supported in the case of the recording medium cassette.

7. A recording medium cassette according to claim 6, wherein one specified information indicating contact among the plurality of information indicating contacts formed on the printed wiring board is connected to some of the rest of the information indicating contacts.

8. A recording medium cassette according to claim 6, wherein one specified information indicating contact among the plurality of information indicating contacts formed on the printed wiring board is isolated from at least some of the rest of the information indicating contacts.

9. A recording and/or reproducing apparatus designed to use at least a small-sized recording medium cassette having a case provided with information indicating means and a large-sized recording medium cassette having a case provided with the same information indicating means as that of the small-sized recording medium cassette, and capable of positioning the small-sized recording medium cassette and the large-sized recording medium cassette therein with respective mouths of the small-sized recording medium cassette and the large-sized recording medium cassette positioned at a fixed position; characterized by fixed information detecting means capable of detecting information indicated by the information indicating means of the small-sized recording medium cassette and the large-sized recording medium cassette, and said information indicating means having a plurality of information indicating contacts formed on a printed wiring board which is arranged in a recess of a wall of the respective case such that the information indicating contacts are positioned so as not to extend beyond an outer surface of the wall and are accessible from the outside through at least one slot in the respective case.

10. A recording and/or reproducing apparatus according to claim 9, wherein said fixed information detecting means comprises a plurality of information detecting contacts respectively corresponding to the information indicating contacts of each of the small-sized recording medium cassette and the large-sized recording medium cassette.

11. A recording medium cassette having a case containing tape reels rotatably supported in the case and a magnetic tape held on the tape reels; said case further containing a plurality of information indicating contacts accessible from outside, said information indicating contacts are formed on a printed wiring board which is fitted in a recess formed in a wall of the case such that the information indicating contacts are accessible through slots formed in the case from outside, in which a specified information indicating contact from the information indicating contacts is connected through resistors to some of the rest of the information indicating contacts.

12. A recording medium cassette having a case containing tape reels rotatably supported in the case and a magnetic tape held on the tape reels; said case further containing a plurality of information indicating contacts accessible from outside, said information indicating contacts are formed on a printed wiring board which is fitted in a recess formed in a wall of the case such that the information indicating contacts are accessible through slots formed in the case from outside, in which a specified information indicating contact from the information indicating contacts is separated from some of the rest of the information indicating contacts.

13. A tape recording and/or reproducing apparatus capable of recording information on a magnetic tape contained in a case of a recording medium cassette and/or of reproducing information recorded on the magnetic tape, said tape recording and/or reproducing apparatus comprising a plurality of information detecting contacts arranged so as to be in contact with a plurality of information indicating contacts formed on the recording medium cassette so as to be accessible from outside, when the recording medium cassette is inserted therein, each of said plurality of information detecting contacts is a torsion coil spring having an upper arm bent in the shape of an inverted letter V and having a contact portion, and a power supply having an output terminal connected to one of the plurality of information detecting contacts.

14. A recording medium cassette to be used on a recording and/or reproducing apparatus designed to use both the recording medium cassette and a small-sized recording medium cassette smaller in size than the former, provided with a mouth across which a portion of a magnetic tape held on tape reels rotating supported in the case thereof is extended, and information indicating means which is the same in size and construction as that included in the small-sized recording medium cassette, characterized in that the recording medium cassette is capable of being inserted in the recording and/or reproducing apparatus and of being positioned in the recording and/or reproducing apparatus with the mouth thereof positioned at a position where the mouth of the small-sized recording medium cassette is to be positioned when the small-sized recording medium cassette is inserted in the recording and/or reproducing apparatus and positioned in the same, and with the information indicating means thereof positioned at a position where the information indicating means of the small-sized recording medium cassette is to be positioned when the small-sized recording medium cassette is inserted in the recording and/or reproducing apparatus and positioned in the same, said information indicating means comprises a plurality of information indicating contacts accessible from outside which are formed on a printed wiring board, the printed wiring board is fitted in a recess formed in one of the walls of the case of the recording medium cassette so that the plurality of information indicating contacts are accessible from outside through slots formed in the case of the recording medium cassette, in which one specified information indicating contact among the plurality of information indicating contacts formed on the printed wiring board is connected through resistors to some of the rest of the information indicating contacts.

15. A recording medium cassette to be used on a recording and/or reproducing apparatus designed to use both the recording medium cassette and a small-sized recording medium cassette smaller in size than the former, provided with a mouth across which a portion of a magnetic tape held on tape reels rotating supported in the case thereof is extended, and information indicating means which is the same in size and construction as that included in the small-sized recording medium cassette, characterized in that the recording medium cassette is capable of being inserted in the recording and/or reproducing apparatus and of being positioned in the recording and/or reproducing apparatus with the mouth thereof positioned at a position where the mouth of the small-sized recording medium cassette is to be positioned when the small-sized recording medium cassette is inserted in the recording and/or reproducing apparatus and positioned in the same, and with the information indicating means thereof positioned at a position where the information indicating means of the small-sized recording medium cassette is to be positioned when the small-sized recording medium cassette is inserted in the recording and/or reproducing apparatus and positioned in the same, said information indicating means comprises a plurality of information indicating contacts accessible from outside which are formed on a printed wiring board, the printed wiring board is fitted in a recess formed in one of the walls of the case of the recording medium cassette so that the plurality of information indicating contacts are accessible from outside through slots formed in the case of the recording medium cassette, in which one specified information indicating contact among the plurality of information indicating contacts formed on the printed wiring board is isolated from some of the rest of the information indicating contacts.

16. A tape recording and/or reproducing apparatus capable of recording information on a magnetic tape contained in a case of a recording medium cassette and/or of reproducing information recorded on the magnetic tape, said tape recording and/or reproducing apparatus comprising a plurality of information detecting contacts arranged so as to be in contact with a plurality of information indicating contacts formed on a printed wiring board which is arranged in a recess of a wall of the case of the recording medium cassette such that the information indicating contacts are positioned so as not to extend beyond an outer surface of the wall of the case and are accessible from outside through at least one slot in the case, when the recording medium cassette is inserted therein, and a power supply having an output terminal connected to one of the plurality of information detecting contacts.

* * * * *